(12) United States Patent
Guo et al.

(10) Patent No.: US 12,418,087 B2
(45) Date of Patent: Sep. 16, 2025

(54) BALUN STRUCTURE AND ELECTRONIC DEVICE

(71) Applicants: Beijing BOE Sensor Technology Co., Ltd., Beijing (CN); BOE Technology Group Co., Ltd., Beijing (CN)

(72) Inventors: Hao Guo, Beijing (CN); Haocheng Jia, Beijing (CN); Yan Lu, Beijing (CN); Yi Ding, Beijing (CN); Wenxue Ma, Beijing (CN); Weisi Zhou, Beijing (CN); Jing Wang, Beijing (CN); Xiaobo Wang, Beijing (CN); Chuncheng Che, Beijing (CN)

(73) Assignees: Beijing BOE Sensor Technology Co., Ltd., Beijing (CN); Boe Technology Group Co., Ltd., Beijing (CN)

( * ) Notice: Subject to any disclaimer, the term of this patent is extended or adjusted under 35 U.S.C. 154(b) by 0 days.

(21) Appl. No.: 18/017,049

(22) PCT Filed: Jan. 21, 2022

(86) PCT No.: PCT/CN2022/073100
§ 371 (c)(1),
(2) Date: Jan. 19, 2023

(87) PCT Pub. No.: WO2023/137685
PCT Pub. Date: Jul. 27, 2023

(65) Prior Publication Data
US 2024/0250400 A1 Jul. 25, 2024

(51) Int. Cl.
*H01P 5/10* (2006.01)
*H03H 7/42* (2006.01)

(52) U.S. Cl.
CPC ............ *H01P 5/10* (2013.01); *H03H 7/42* (2013.01)

(58) Field of Classification Search
CPC .................................. H01P 5/10; H03H 7/42
See application file for complete search history.

(56) References Cited

U.S. PATENT DOCUMENTS 5,697,088 A * 12/1997 Gu ..................... H01P 1/20363
333/204
7,479,855 B2 * 1/2009 Yata ................... H03H 9/14532
333/195
(Continued)

FOREIGN PATENT DOCUMENTS

CN 101320835 A 12/2008
CN 107579317 A * 1/2018
(Continued)

*Primary Examiner* — Andrea Lindgren Baltzell
*Assistant Examiner* — Kimberly E Glenn
(74) *Attorney, Agent, or Firm* — IPro, PLLC

(57) ABSTRACT

A balun structure and an electronic device. The balun structure includes: a dielectric substrate; a first grounding conductive layer, a first transmission line, a second transmission line, and a third transmission line, wherein at least one coupling structure is connected in series between a first end and a second end of the third transmission line. The coupling structure includes a first coupling part and a second coupling part, wherein in the same coupling structure, one end of the first coupling part facing the second coupling part has at least one first branch line, and one end of the second coupling part facing the first coupling part has at least one second branch line; and in the same coupling structure, the first branch line of the first coupling part is in coupling connection with the second branch line of the second coupling part.

20 Claims, 13 Drawing Sheets

(56) References Cited

U.S. PATENT DOCUMENTS

| | | |
|---|---|---|
| 2003/0001710 A1 | 1/2003 | Tang et al. |
| 2004/0135647 A1 | 7/2004 | Cheung et al. |
| 2008/0252393 A1 | 10/2008 | Kearns et al. |
| 2014/0240056 A1 | 8/2014 | Isom et al. |

FOREIGN PATENT DOCUMENTS

| | | | |
|---|---|---|---|
| CN | 113764851 A | | 12/2021 |
| WO | WO-2020176054 A1 | * | 9/2020 |

* cited by examiner

BALUN STRUCTURE AND ELECTRONIC DEVICE

The present application is a National Stage of International Application No. PCT/CN2022/073100, filed on Jan. 21, 2022, which is hereby incorporated by reference in its entirety.

FIELD

The present disclosure relates to the technical field of microwave communication, in particular to a balun structure and an electronic device.

BACKGROUND

A balun is a three-port device. As a conversion device between a balanced port and an unbalanced port, it can realize mutual conversion between a differential signal and a single ended signal, and is widely used in balanced layout of the microwave communication field. With the development of electronic devices towards miniaturization, lightweight and high performance, higher requirements are put forward for the size and performance of the balun. For example, a flux coupled transformer balun is the most common type of balun, which is basically composed of a magnetic core and two different wires wound on the magnetic core, and has a large volume. The most suitable working condition of this type of balun is below 1 GHz. For another example, a classical transformer balun, in which there are two independent coil windings wound on a transformer core. For yet another example, an autotransformer balun has one coil or two coils or more than two coils, and electrical wirings of these coils are also wound on a ring core. In addition, there are a delay line balun, a self-resonant balun, etc., but these balun forms are relatively large in volume.

SUMMARY

A balun structure provided by an embodiment of the present disclosure, includes: a dielectric substrate; a first grounding conductive layer, located on one side of the dielectric substrate; a first transmission line, located on one side of the dielectric substrate away from the first grounding conductive layer, wherein a first end of the first transmission line is electrically connected with an unbalanced signal port; a second transmission line, located on the side of the dielectric substrate away from the first grounding conductive layer, wherein a first end of the second transmission line is electrically connected with a second end of the first transmission line, and a second end of the second transmission line is electrically connected with a first balanced signal port; and a third transmission line, located on the side of the dielectric substrate away from the first grounding conductive layer, wherein a first end of the third transmission line is electrically connected with the second end of the first transmission line, and a second end of the third transmission line is electrically connected with a second balanced signal port.

At least one coupling structure is connected in series between the first end and the second end of the third transmission line; the coupling structure includes a first coupling part and a second coupling part, in the same coupling structure, one end of the first coupling part facing the second coupling part has at least one first branch line, and one end of the second coupling part facing the first coupling part has at least one second branch line; in the same coupling structure, one end of the first branch line close to the second coupling part is electrically connected with the first grounding conductive layer through a first through hole, and one end of the second branch line close to the first coupling part is electrically connected with the first grounding conductive layer through a second through hole; and in the same coupling structure, the first branch line of the first coupling part is in coupling connection with the second branch line of the second coupling part.

In some examples, in the same coupling structure, orthographic projections of the first branch line and the second branch line on the dielectric substrate are alternately arranged at intervals.

In some examples, the first coupling part and the second coupling part in each coupling structure are arranged in the same layer.

In some examples, the first transmission line, the second transmission line, the third transmission line and each coupling structure are located in the same film layer.

In some examples, the first coupling part and the second coupling part in at least one coupling structure are arranged on different layers.

In some examples, the first transmission line, the second transmission line and the first coupling part are located in the same film layer; the second coupling part is located between the first coupling part and the dielectric substrate; the balun structure further includes: a first insulating layer, located between the second coupling part and the first coupling part; and the first through hole further penetrates through the first insulating layer.

In some examples, the first transmission line, the second transmission line and the first coupling part are located in the same film layer; the second coupling part is located on one side of the first coupling part away from the dielectric substrate; the balun structure further includes: a second insulating layer, located between the second coupling part and the first coupling part; and the second through hole further penetrates through the second insulating layer.

In some examples, the balun structure further includes: a third insulating layer, covering the first transmission line, the second transmission line and the third transmission line; and a second grounding conductive layer, located on one side of the third insulating layer away from the dielectric substrate; wherein one end of the first branch line close to the second coupling part is electrically connected with the second grounding conductive layer through a third through hole, and one end of the second branch line close to the first coupling part is electrically connected with the second grounding conductive layer through a fourth through hole; and the third through hole and the fourth through hole penetrate through the third insulating layer respectively.

In some examples, when the balun structure further includes the first insulating layer, the fourth through hole further penetrates through the first insulating layer; and when the balun structure further includes the second insulating layer, the third through hole further penetrates through the second insulating layer.

In some examples, at least one coupling structure is connected in series between the first end and the second end of at least one of the first transmission line or the second transmission line.

In some examples, in the same coupling structure, shapes of the orthographic projections of the first branch line and the second branch line on the dielectric substrate include a straight line, a bent line, a wavy line and a curve.

In some examples, the balun structure further includes: at least one resistor, electrically connected between the second end of the second transmission line and the second end of the third transmission line.

An embodiment of the present disclosure further provides an electronic device, including the above balun structure.

DETAILED DESCRIPTION OF THE EMBODIMENTS

Figure 1A:
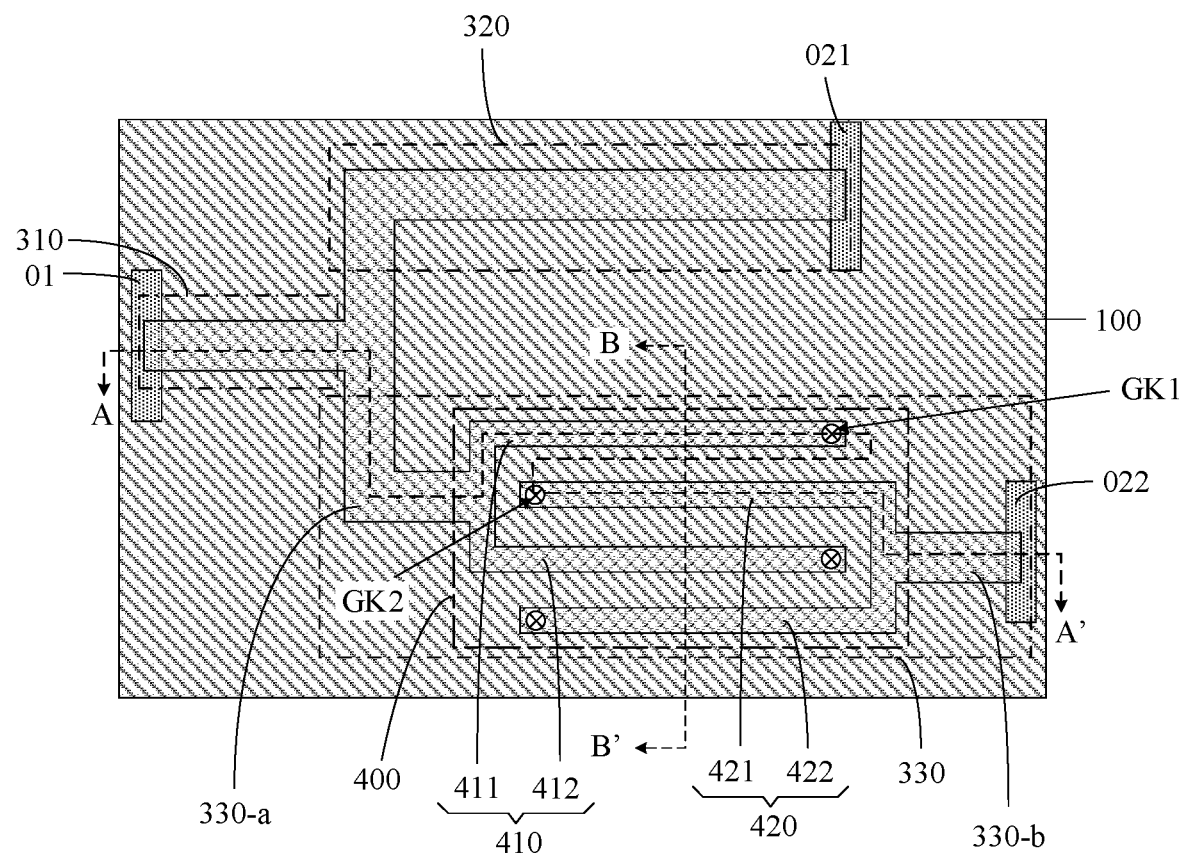
FIG. 1A is some schematic top views of a balun structure provided by an embodiment of the present disclosure.

In order to make objectives, technical solutions and advantages of embodiments of the present disclosure clearer, the technical solutions of the embodiments of the present disclosure will be clearly and completely described below in conjunction with accompanying drawings of the embodiments of the present disclosure. Apparently, the described embodiments are only a part of the embodiments of the present disclosure, not all of the embodiments. The embodiments in the present disclosure and features in the embodiments can be combined with each other in the case of not conflicting. Based on the described embodiments of the present disclosure, all other embodiments obtained by those ordinarily skilled in the art without creative work shall fall within the scope of protection of the present disclosure.

Unless otherwise defined, technical or scientific terms used in the present disclosure shall have the ordinary meanings understood by those ordinarily skilled in the art to which the present disclosure pertains. The words "first", "second" and the like used in the present disclosure do not indicate any order, quantity or importance, but are only used to distinguish different components. The words "comprise" or "include" and the like indicate that an element or item appearing before such word covers listed elements or items appearing after the word and equivalents thereof, and does not exclude other elements or items. The words "connect" or "couple" and the like are not limited to physical or mechanical connection, but may include electrical connection, whether direct or indirect.

It needs to be noted that the sizes and shapes of all figures in the accompanying drawings do not reflect true scales, and are only intended to schematically illustrate the content of the present disclosure. The same or similar reference numerals represent the same or similar elements or elements with the same or similar functions all the time.

In the field of microwave and radio-frequency, differential circuits and baluns are widely used in the design of communication base station products, mobile products and chips. Generally, differential signals are used to eliminate common mode noise, and the mutual conversion between single ended signals and the differential signals is realized through the baluns. The differential signals are composed of a pair of power dividing signals with opposite phases.

Figure 1B:
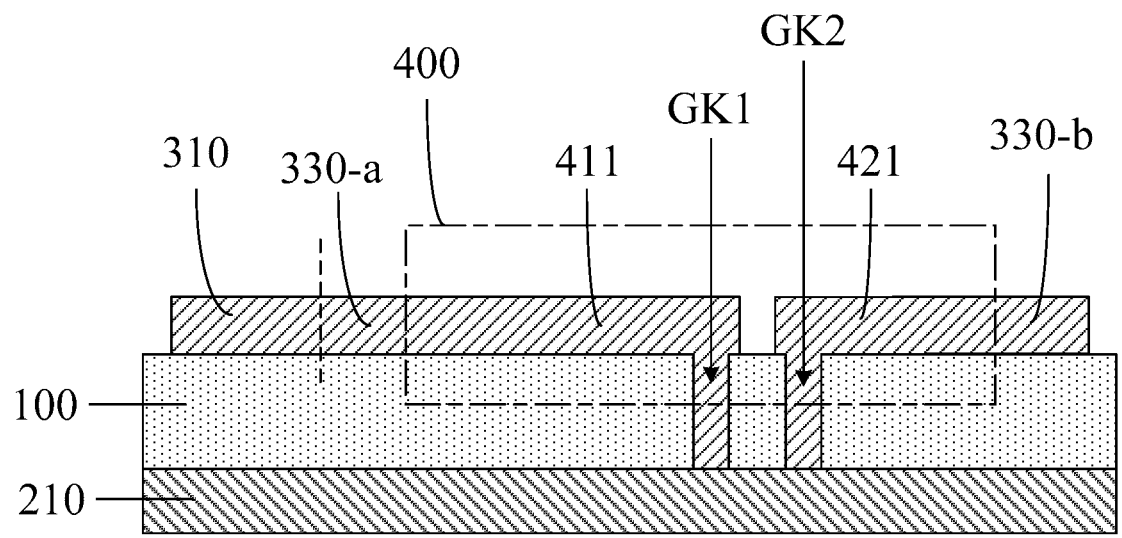
FIG. 1B is some schematic sectional views of the balun structure shown in FIG. 1A in a direction AA'.
Figure 1C:
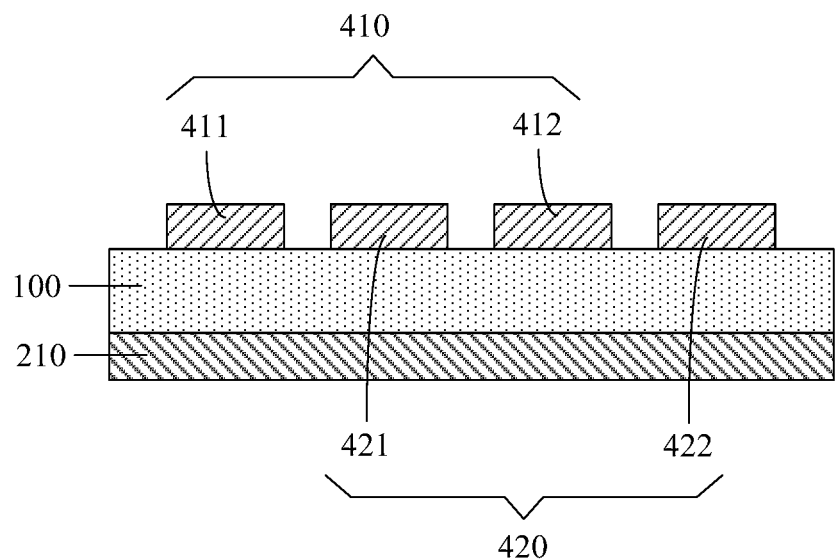
FIG. 1C is some schematic sectional views of the balun structure shown in FIG. 1A in a direction BB'.

As shown in FIG. 1A to FIG. 1C, a balun structure provided by an embodiment of the present disclosure may include: a dielectric substrate 100, a first grounding conductive layer 210 on one side of the dielectric substrate 100, and a first transmission line 310, a second transmission line 320 and a third transmission line 330 which are located on one side of the dielectric substrate 100 away from the first grounding conductive layer 210. Exemplarily, the dielectric substrate 100 may be formed by a dielectric layer. The dielectric layer may be formed by an insulating material.

In the embodiment of the present disclosure, as shown in FIG. 1A to FIG. 1C, a first end of the first transmission line 310 may be electrically connected with an unbalanced signal port 01. A first end of the second transmission line 320 is electrically connected with a second end of the first transmission line 310, and a second end of the second transmission line 320 is electrically connected with a first balanced signal port 021. A first end 330-*a* of the third transmission line 330 is electrically connected with the second end of the first transmission line 310, and a second end 330-*b* of the third transmission line 330 is electrically connected with a second balanced signal port 022. At least one coupling structure 400 is connected in series between the first end 330-*a* and the second end 330-*b* of the third transmission line 330. The coupling structure 400 may include a first coupling part 410 and a second coupling part 420.

Exemplarily, as shown in FIG. 1A, in the same coupling structure 400, one end of the first coupling part 410 facing the second coupling part 420 has at least two first branch lines (such as 411 and 412), and one end of the second coupling part 420 facing the first coupling part 410 has at least two second branch lines (such as 421 and 422). In the same coupling structure 400, one end of each of the first branch lines (such as 411 and 412) close to the second coupling part 420 is electrically connected with the first grounding conductive layer 210 through a first through hole GK1, and one end of each of the second branch lines (such as 421 and 422) close to the first coupling part 410 are electrically connected with the first grounding conductive layer 210 through a second through hole GK2; and in the same coupling structure 400, the first branch lines of the first coupling part 410 are in coupling connection with the second branch lines of the second coupling part 420. For example, the first branch line 411 and the second branch line 421 have a gap therebetween and are in coupling connection, the second branch line 421 and the first branch lines 411 and 412 have gaps therebetween and are in coupling connection, and the first branch line 412 and the second branch lines 421 and 422 have gaps therebetween and are in coupling connection. In this way, signals transmitted to the first branch lines (such as 411 and 412) may be transmitted to the second branch lines (such as 421 and 422) through a coupling effect, so as to be transmitted to a connected device through the second end 330-*b* of the third transmission line 330. Alternatively, signals transmitted to the second branch lines (such as 421 and 422) may be transmitted to the first branch lines (such as 411 and 412) through the coupling effect, so as to be transmitted to a device connected to the first transmission line 310 through the first end 330-*a* of the third transmission line 330.

In the embodiment of the present disclosure, a layer of metal materials (such as Cu, Ag, Au and Al) may be plated on side walls of the first through hole and the second through hole, or the first through hole and the second through hole may also be filled with the metal materials (such as Cu, Ag, Au and Al) first, then the first branch line is connected with the metal materials filling in the first through hole, and the second branch line is connected with the metal materials filling in the second through hole. Alternatively, the first through hole and the second through hole may also be filled with materials for preparing the first branch line and the second branch line while the first branch line and the second branch line are prepared.

Exemplarily, in the balun structure provided by the embodiment of the present disclosure, the unbalanced signal port 01 may be connected with an unbalanced transmission line such as a coaxial line and a microstrip line, and the first balanced signal port 021 and the second balanced signal port 022 may be connected with a device such as a push-pull amplifier, a balanced mixer and a balanced antenna, or a balanced transmission line. The balun structure may also be applied to a liquid crystal phase shifter of a liquid crystal phased array antenna system. In this way, when the device connected to the unbalanced signal port 01 inputs an unbalanced signal through the unbalanced signal port 01, the unbalanced signal is converted into a differential signal through the above balun structure and the differential signal is output to the connected device from the first balanced signal port 021 and the second balanced signal port 022. Alternatively, when the device connected to the first balanced signal port 021 and the second balanced signal port 022 inputs a differential signal through the first balanced signal port 021 and the second balanced signal port 022, the differential signal is converted into an unbalanced signal through the above balun structure and is output to the connected device from the unbalanced signal port 01. For example, the balun structure is used for switching coaxial connection to a balanced antenna. In this way, a phase offset of 180° may be generated, and a balanced input may be provided.

According to the balun structure provided by the embodiment of the present disclosure, in the same coupling structure 400, by setting that the end of the first coupling part 410 facing the second coupling part 420 has at least one first branch line, and the end of the second coupling part 420 facing the first coupling part 410 has at least one second branch line, in the same coupling structure 400, the first branch line of the first coupling part 410 and the second branch line of the second coupling part 420 are in coupling connection, so as to generate the coupling effect between the first branch line and the second branch line. The coupling effect generates a phase delay, so that a phase difference between the signal transmitted by the first balanced signal port 021 and the signal transmitted by the second balanced signal port 022 may be 180°. In addition, the sizes of the first transmission line 310, the second transmission line 320, the third transmission line 330, the first branch line and the second branch line may be appropriately designed (for example, lengths of the second transmission line 320 and the third transmission line 330 may be about a quarter of a dielectric wavelength, and their widths may be appropriate sizes that meet impedance matching requirements), so that an output power of the first balanced signal port 021 may be the same as an output power of the second balanced signal port 022. Furthermore, the first grounding conductive layer 210 is arranged in a grounding mode, in the same coupling structure 400, the end of the first branch line close to the second coupling part 420 is electrically connected with the first grounding conductive layer 210 through the first through hole GK1, and the end of the second branch line close to the first coupling part 410 is electrically connected with the first grounding conductive layer 210 through the second through hole GK2, which can improve electromagnetic shielding and suppress noise interference. In addition, the balun structure provided by the embodiment of the present disclosure is relatively simple in design and easy to manufacture and integrate.

In the embodiment of the present disclosure, as shown in FIG. 1A to FIG. 1C, in the same coupling structure 400, orthographic projections of the first branch line and second branch line on the dielectric substrate 100 may be alternately arranged at intervals. For example, an orthographic projection of the first branch line 411 on the dielectric substrate 100, an orthographic projection of the second branch line 421 on the dielectric substrate 100, an orthographic projection of the first branch line 412 on the dielectric substrate 100 and an orthographic projection of the second branch line 422 on the dielectric substrate 100 are alternately arranged at intervals. In this way, the coupling structure 400 may be formed to form an interdigital linear structure, so that the phase delay may be generated through the coupling effect between the first branch line and the second branch line which are mutually staggered in the same coupling structure 400. Therefore, the phase difference between the signal transmitted by the first balanced signal port 021 and the signal transmitted by the second balanced signal port 022 is 180°.

In the embodiment of the present disclosure, as shown in FIG. 1A, a material of the first transmission line 310 may be a metal material, such as Cu, Ag, Au and Al. The first transmission line 310 may be set as a linear routing form. For example, as shown in FIG. 1A, a shape of the orthographic projection of the first transmission line 310 on the dielectric substrate 100 may be set as a linear shape. Of course, the shape of the orthographic projection of the first transmission line 310 on the dielectric substrate 100 may also be set as a bent line, a wavy line, a curve line and the like, which may be determined according to the needs of actual application, and is not limited here.

In the embodiment of the present disclosure, as shown in FIG. 1A, a material of the second transmission line 320 may be a metal material, such as Cu, Ag, Au and Al. The second transmission line 320 may also be set as a linear routing form. For example, as shown in FIG. 1A, a shape of the orthographic projection of the second transmission line 320 on the dielectric substrate 100 may be set as a linear shape. Of course, the shape of the orthographic projection of the second transmission line 320 on the dielectric substrate 100 may also be set as a bent line, a wavy line, a curve line and the like, which may be determined according to the needs of actual application, and is not limited here.

Figure 3:
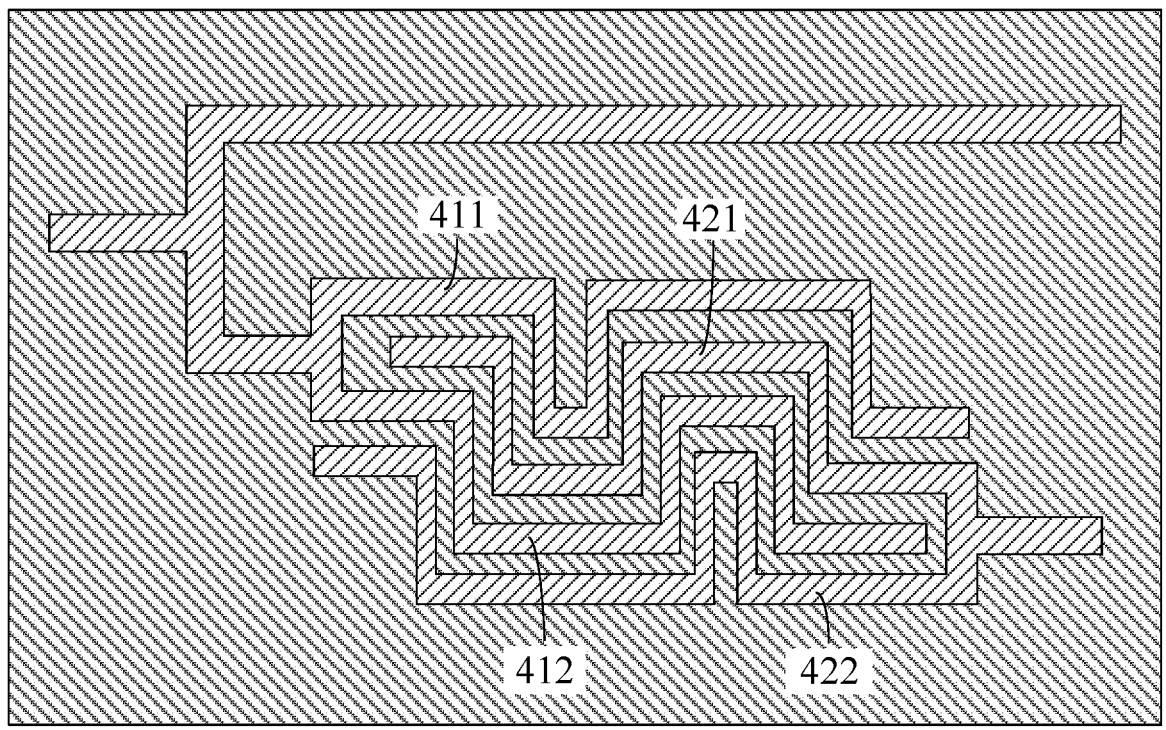
FIG. 3 is some other schematic top views of a balun structure provided by an embodiment of the present disclosure.

In the embodiment of the present disclosure, as shown in FIG. 1A, materials of the first branch lines (such as 411 and 412) and the second branch lines (such as 421 and 422) may be metal materials, such as Cu, Ag, Au and Al. In the same coupling structure 400, the shape of the orthographic projections of the first branch lines (such as 411 and 412) and the second branch lines (such as 421 and 422) on the dielectric substrate 100 may be set as a linear shape. Alternatively, as shown in FIG. 3, in the same coupling structure 400, the shape of the orthographic projections of the first branch lines (such as 411 and 412) and the second branch lines (such as 421 and 422) on the dielectric substrate 100 may also be set as a bent line, so as to further reduce the size. Of course, in the same coupling structure 400, the shape of the orthographic projections of the first branch lines and the second branch lines on the dielectric substrate 100 may also be set as structures such as a wavy line and a curve line, which is not limited here.

In the embodiment of the present disclosure, as shown in FIG. 1A and FIG. 1C, the first coupling part 410 and the second coupling part 420 in each coupling structure 400 are arranged in the same layer. In this way, the pattern of the first coupling part 410 and the second coupling part 420 in each coupling structure 400 may be formed through a single mask patterning process, which can simplify a preparation process, save a production cost and improve production efficiency.

In the embodiment of the present disclosure, as shown in FIG. 1A to FIG. 1C, the first transmission line 310, the second transmission line 320, the third transmission line 330 and each coupling structure 400 may be located in the same film layer, so that the balun structure is prepared in a form of microstrip lines. In this way, the pattern of the first transmission line 310, the second transmission line 320, third transmission line 330 and each coupling structure 400 may be formed through the single mask patterning process, which can simplify the preparation process, save the production cost and improve the production efficiency.

Figure 1D:
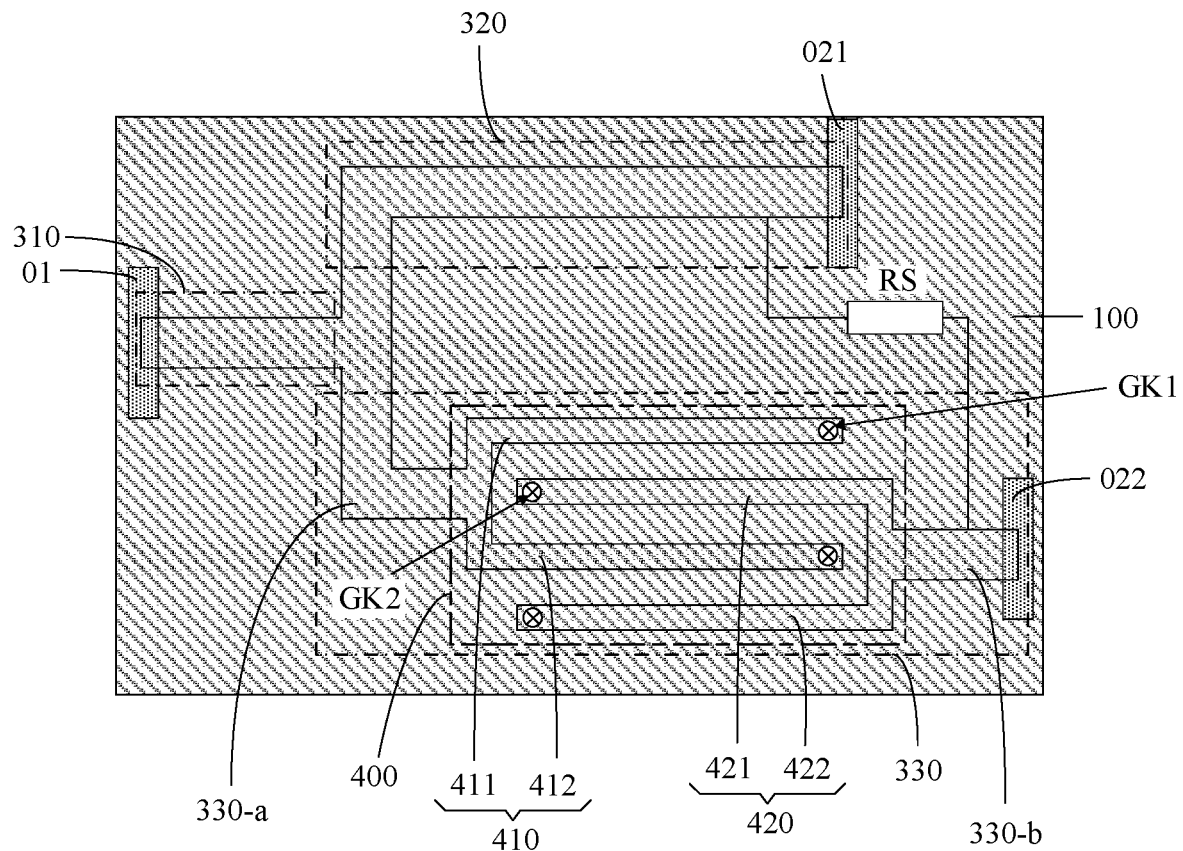
FIG. 1D is other schematic top views of a balun structure provided by an embodiment of the present disclosure.

In the embodiment of the present disclosure, as shown in FIG. 1D, the balun structure may further include: at least one resistor RS. Each resistor RS is electrically connected between the second end of the second transmission line 320 and the second end 330-b of the third transmission line 330. In this way, matching of output ports of the balun structure and isolation between the output ports can be improved. Exemplarily, the balun structure may be provided with one resistor. Alternatively, the balun structure may also be provided with two resistors. Alternatively, the balun structure may be provided with three or more resistors. Of course, in the embodiment of the present disclosure, as shown in FIG. 1A, the balun structure may also be not provided with the resistors RS. In practical applications, the quantity of the resistors may be determined according to the needs in actual applications, which is not limited here.

Figure 2A:
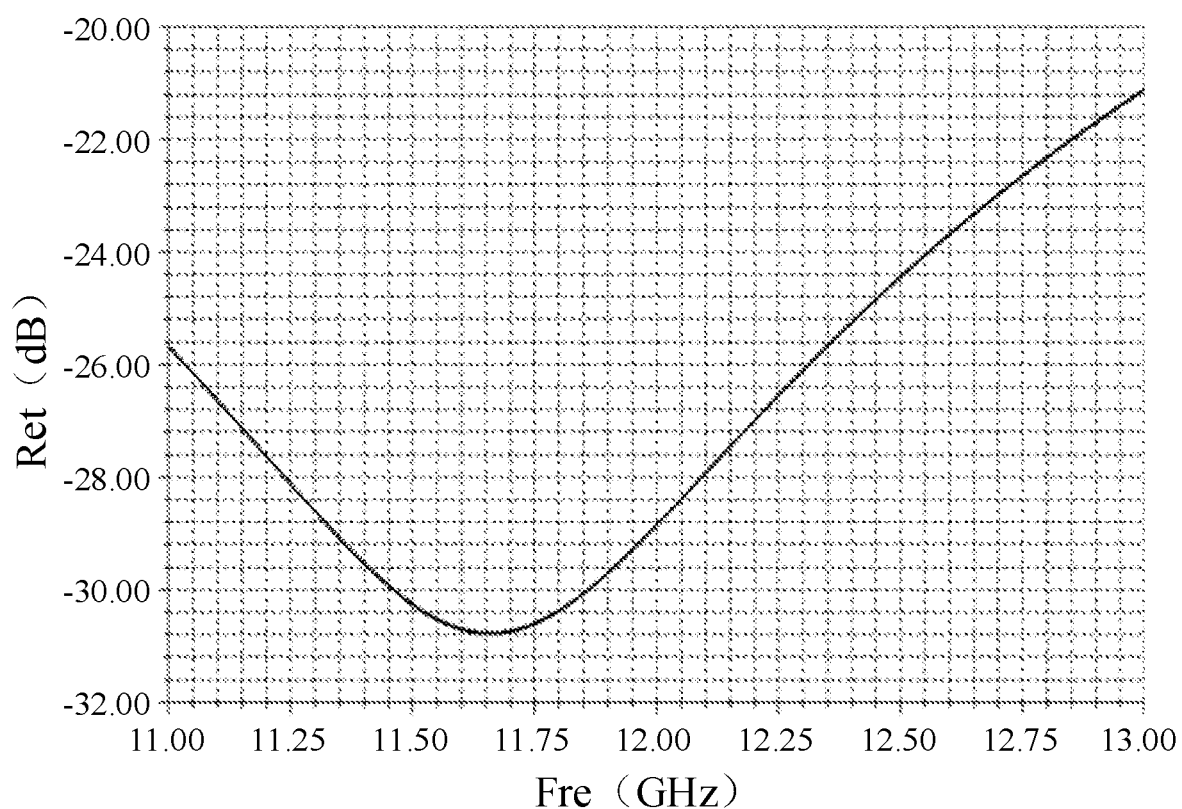
FIG. 2A is a schematic diagram of return loss of a balun structure in an embodiment of the present disclosure when applied to radio-frequency signal transmission in a 12 GHz frequency band.
Figure 2B:
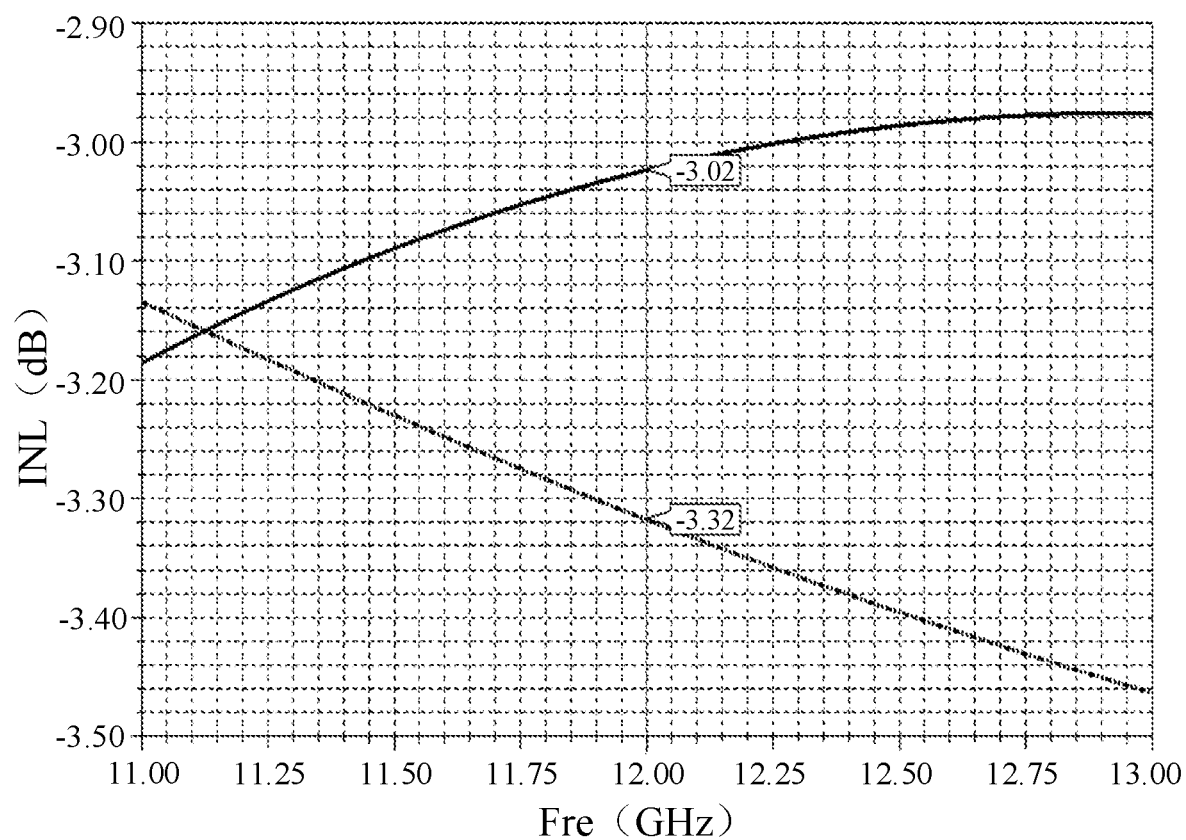
FIG. 2B is a schematic diagram of insertion loss of a balun structure in an embodiment of the present disclosure when applied to radio-frequency signal transmission in a 12 GHz frequency band.
Figure 2C:
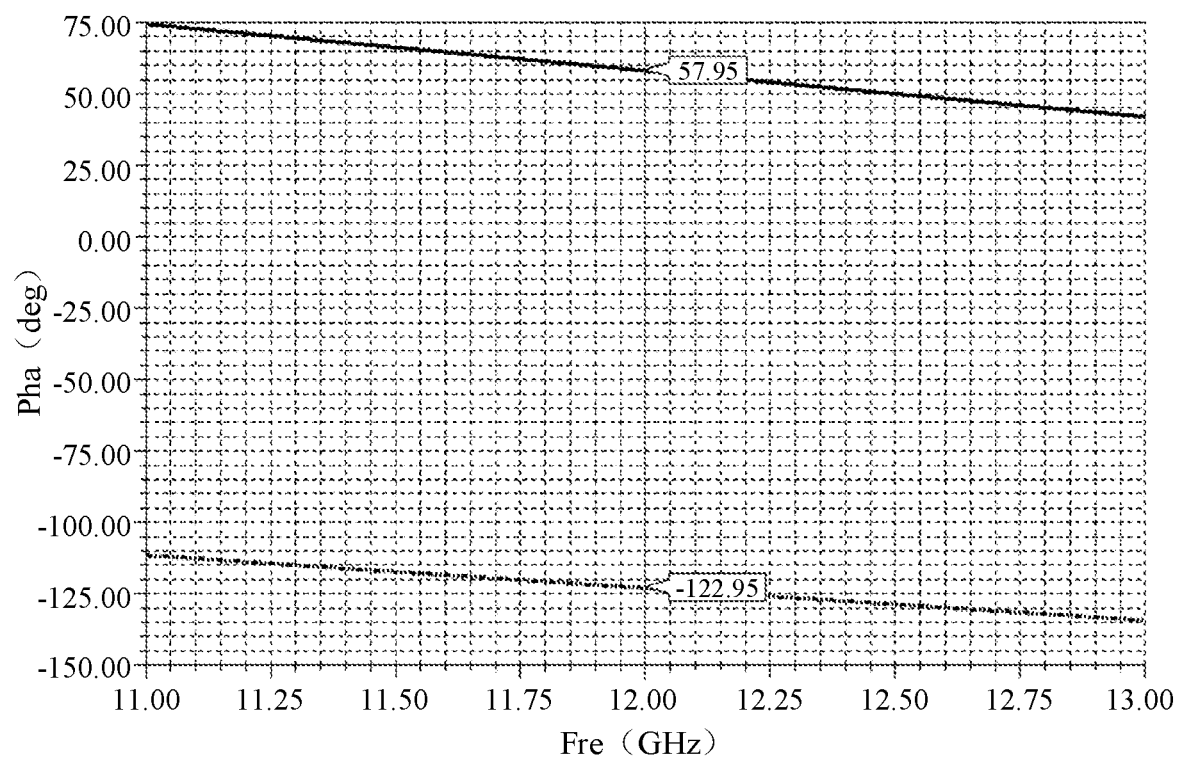
FIG. 2C is a schematic diagram of a phase of a signal of a balun structure in an embodiment of the present disclosure when applied to radio-frequency signal transmission in a 12 GHz frequency band.

When the balun structure in the embodiment of the present disclosure is applied to the radio-frequency signal transmission in the 12 GHz frequency band, the return loss of the unbalanced signal port 01 is shown in FIG. 2A (an abscissa represents a frequency, and an ordinate represents the return loss), the insertion losses from the unbalanced signal port 01 to the first balanced signal port 021 and the second balanced signal port 022 are shown in FIG. 2B (the abscissa represents the frequency, and the ordinate represents the insertion loss), and the phases of the signals of the first balanced signal port 021 and the second balanced signal port 022 are shown in FIG. 2C (the abscissa represents the frequency, and the ordinate represents the phase). It can be seen from FIG. 2A that the return loss of the unbalanced signal port 01 is less than −20 dB in the range of 11 GHz to 12 GHz. It can be seen from FIG. 2B that the insertion loss from the unbalanced signal port 01 to the first balanced signal port 021 and the insertion loss from the unbalanced signal port 01 to the second balanced signal port 022 are respectively −3.02 dB and −3.32 dB at 12 GHz. It can be seen from FIG. 2C that the phase difference between the signals of the first balance signal port 021 and the second balance signal port 022 is 180.9°.

Figure 4A:
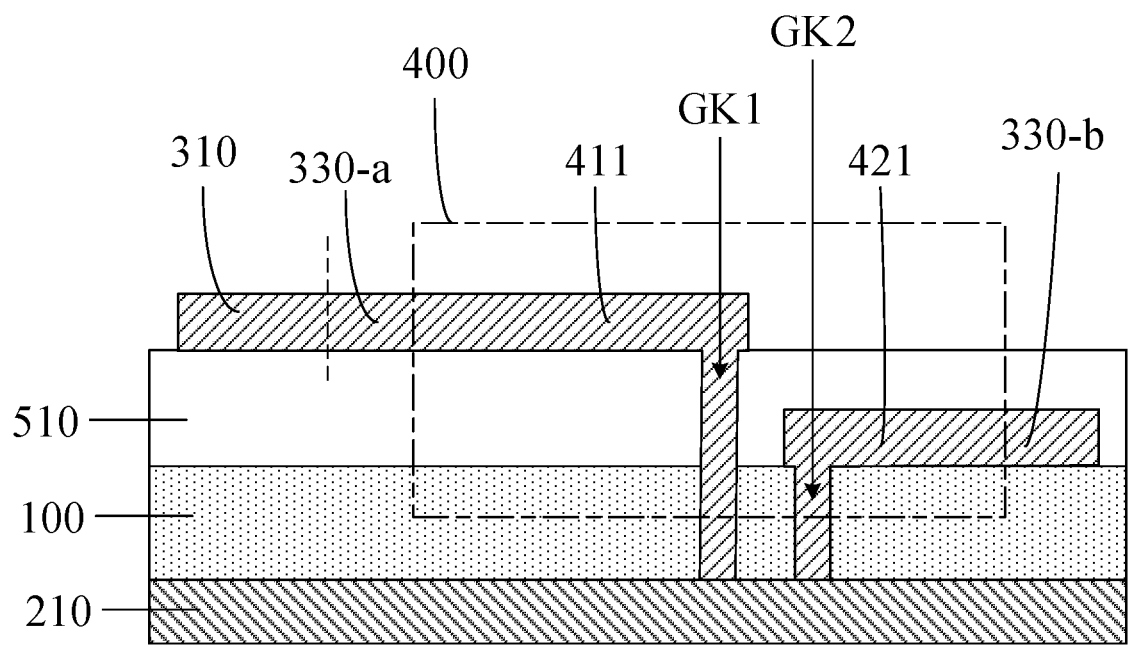
FIG. 4A is other schematic sectional views of the balun structure shown in FIG. 1A in the direction AA'.
Figure 4B:
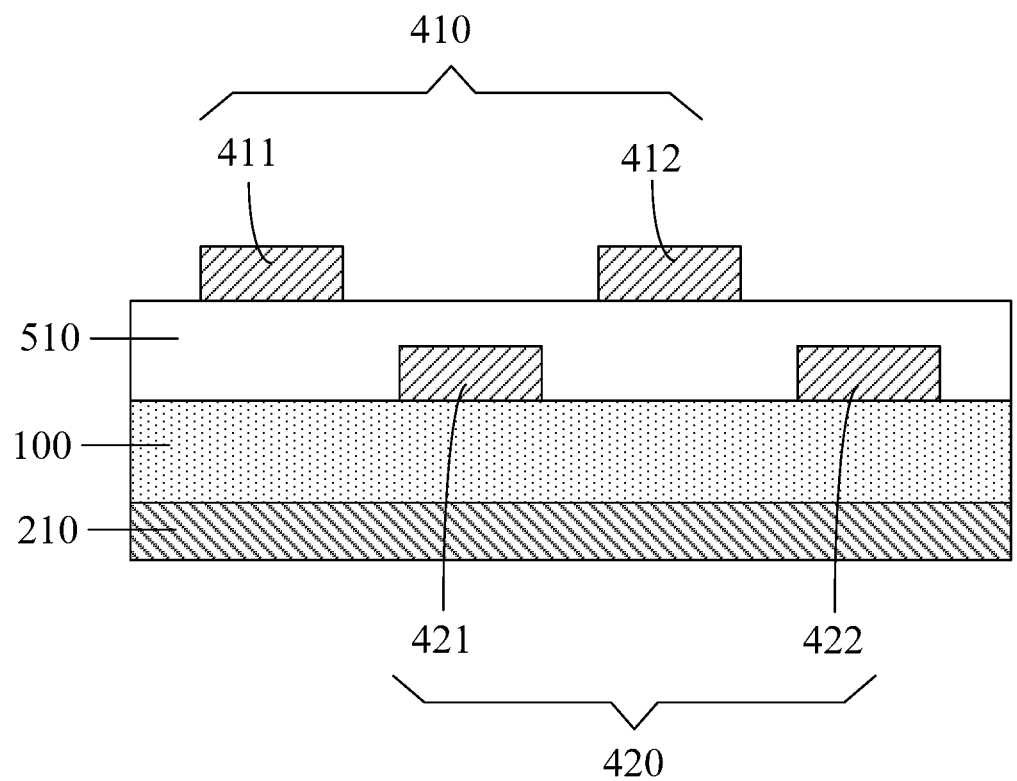
FIG. 4B is other schematic sectional views of the balun structure shown in FIG. 1A in the direction BB'.

The embodiment of the present disclosure further provides some other schematic structural diagrams of the balun structure, as shown in FIG. 4A and FIG. 4B, and transformation is performed for the implementation of the above embodiments. Only the difference between the present embodiment and the above embodiments is explained below, and similarities are omitted here.

In the embodiment of the present disclosure, the first coupling part 410 and the second coupling part 420 in at least one coupling structure 400 are arranged on different layers. Exemplarily, a plurality of coupling structures 400 may be arranged in the third transmission line 330, so that the first coupling part 410 and the second coupling part 420 in one of the coupling structures 400 may be arranged on different layers, and the first coupling parts 410 and the second coupling parts 420 in other coupling structures 400 are arranged in the same layer. Alternatively, the first coupling parts 410 and the second coupling parts 420 in two of the coupling structures 400 may be arranged on different layers, and the first coupling parts 410 and the second coupling parts 420 in other coupling structures 400 are arranged in the same layer. Alternatively, the first coupling parts 410 and the second coupling parts 420 in three of the coupling structures 400 may be arranged on different layers, and the first coupling parts 410 and the second coupling parts 420 in other coupling structures 400 are arranged in the same layer. Of course, as shown in FIG. 4A and FIG. 4B, one coupling structure 400 may be arranged in the third transmission line 330, so that the first coupling part 410 (including the first branch lines 411 and 412) and the second coupling part 420 (including the second branch lines 421 and 422) in the coupling structure 400 may be arranged on different layers. Exemplarily, the first transmission line 310, the second transmission line 320 and the first coupling part 410 are located in the same film layer. In addition, the second coupling part 420 (including the second branch lines 421 and 422) is located between the first coupling part 410 (including the first branch lines 411 and 412) and the dielectric substrate 100. The balun structure further includes: a first insulating layer 510 located between the second coupling part 420 and the first coupling part 410, and the first through hole GK1 further penetrates through the first insulating layer 510. Exemplarily, the first insulating layer 510 may be formed by a dielectric layer. It needs to be noted that the first coupling part 410 (including the first branch lines 411 and 412) and the first end 330-*a* of the third transmission line 330 are of an integrated structure arranged in the same layer. The second coupling part 420 (including the second branch lines 421 and 422) and the second end 330-*b* of the third transmission line 330 are of an integrated structure arranged in the same layer. That is, the first coupling part 410 (including the first branch lines 411 and 412) and the first end 330-*a* of the third transmission line 330 serve as a film layer, the second coupling part 420 (including the second branch lines 421 and 422) and the second end 330-*b* of the third transmission line 330 serve as the other film layer, and the first insulating layer 510 is arranged between the two film layers.

Figure 5A:
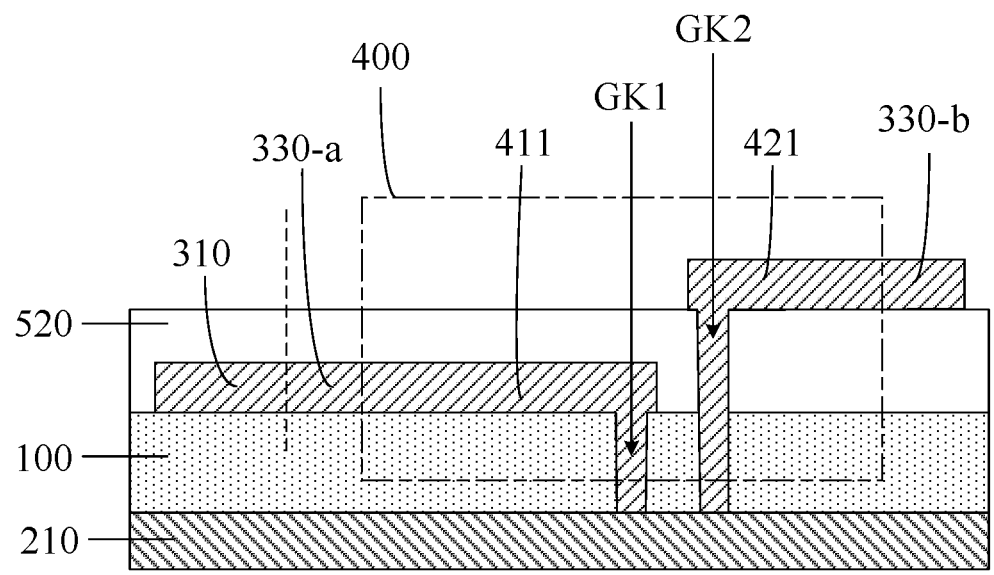
FIG. 5A is yet some schematic sectional views of the balun structure shown in FIG. 1A in the direction AA'.
Figure 5B:
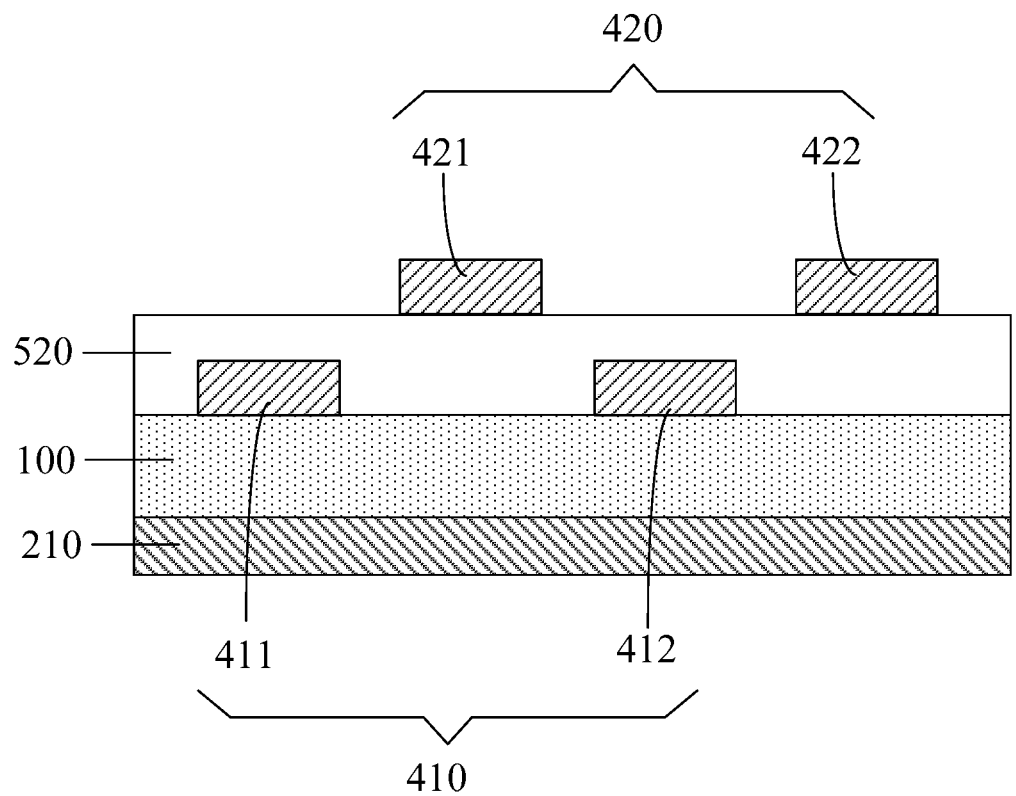
FIG. 5B is yet some schematic sectional views of the balun structure shown in FIG. 1A in the direction BB'.

The embodiment of the present disclosure provides yet some schematic structural diagrams of the balun structure, as shown in FIG. 5A and FIG. 5B, and transformation is performed for the implementation of the above embodiments. Only the difference between the present embodiment and the above embodiments is explained below, and similarities are omitted here.

In the embodiment of the present disclosure, as shown in FIG. 5A and FIG. 5B, one coupling structure 400 may be arranged in the third transmission line 330, so that the first coupling part 410 and the second coupling part 420 in the coupling structure 400 may be arranged on different layers. Exemplarily, the first transmission line 310, the second transmission line 320 and the first coupling part 410 may be located in the same film layer, and the second coupling part 420 is located on one side of the first coupling part 410 away from the dielectric substrate. In addition, the balun structure further includes: a second insulating layer 520 located between the second coupling part 420 and the first coupling part 410, and the second through hole GK2 further penetrates through the second insulating layer 520. Exemplarily, the second insulating layer 520 may be formed by a dielectric layer. It needs to be noted that the first coupling part 410 (including the first branch lines 411 and 412) and the first end 330-*a* of the third transmission line 330 are of an integrated structure arranged in the same layer. The second coupling part 420 (including the second branch lines 421 and 422) and the second end 330-*b* of the third transmission line 330 are of an integrated structure arranged in the same layer. That is, the first coupling part 410 (including the first branch lines 411 and 412) and the first end 330-*a* of the third transmission line 330 serve as a film layer, the second coupling part 420 (including the second branch lines 421 and 422) and the second end 330-*b* of the third transmission line 330 serve as the other film layer, and the second insulating layer 520 is arranged between the two film layers.

Figure 6A:
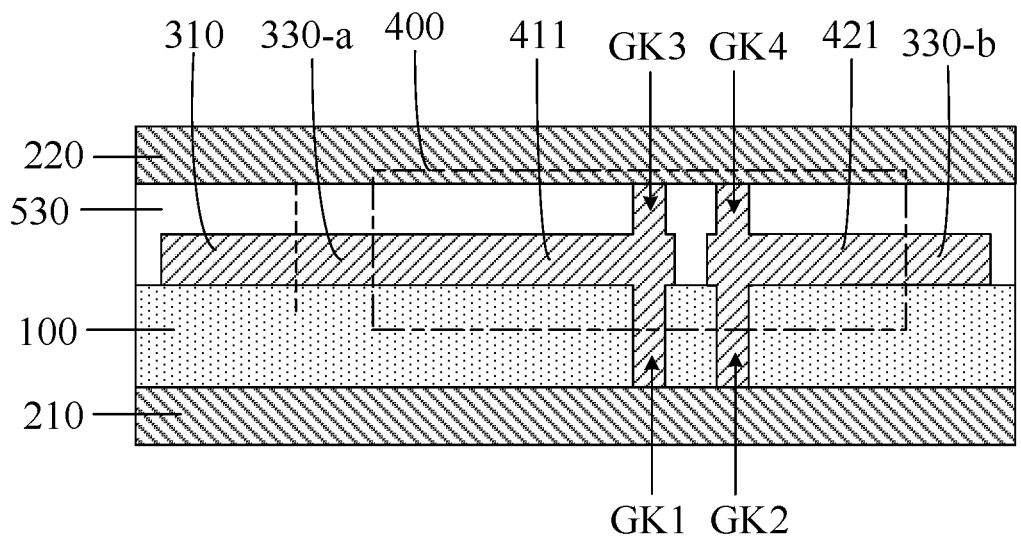
FIG. 6A is yet some schematic sectional views of the balun structure shown in FIG. 1A in the direction AA'.
Figure 6B:
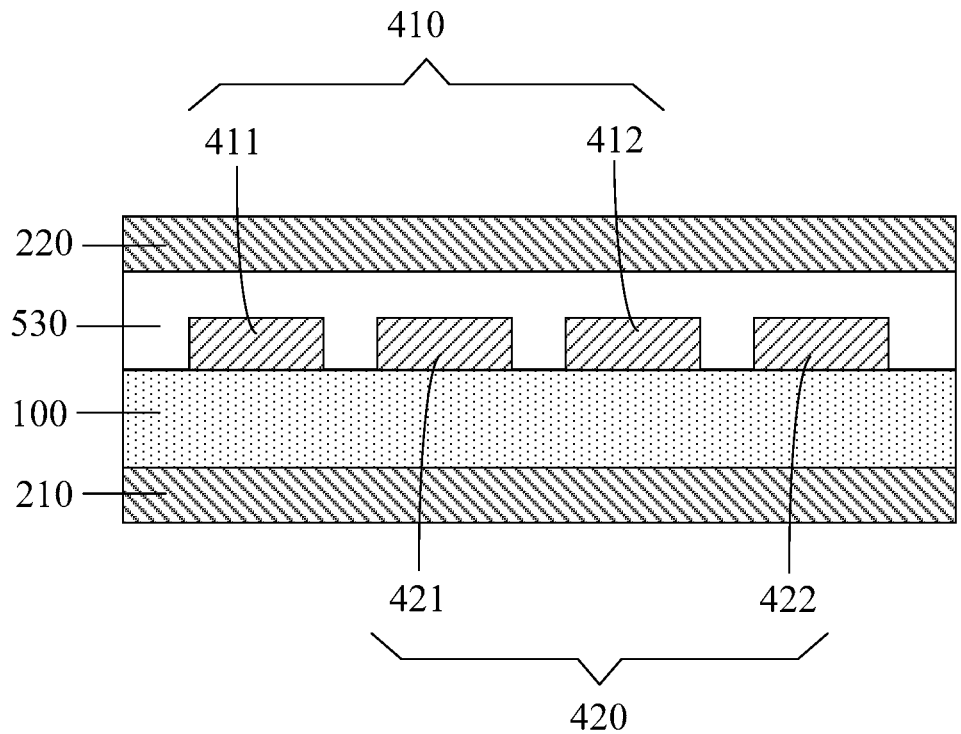
FIG. 6B is yet some schematic sectional views of the balun structure shown in FIG. 1A in the direction BB'.

The embodiment of the present disclosure provides yet some schematic structural diagrams of the balun structure, as shown in FIG. 6A and FIG. 6B, and transformation is performed for the implementation of the above embodiments. Only the difference between the present embodiment and the above embodiments is explained below, and similarities are omitted here.

In the embodiment of the present disclosure, as shown in FIG. 6A and FIG. 6B, the balun structure may further include: a third insulating layer 530 covering the first transmission line 310, the second transmission line 320 and the third transmission line 330, and a second grounding conductive layer 220 located on one side of the third insulating layer 530 away from the dielectric substrate 100. In addition, one end of the first branch line (such as 411) close to the second coupling part 420 is electrically connected with the second grounding conductive layer 320 through a third through hole GK3, and one end of the second branch line (such as 421) close to the first coupling part 410 is electrically connected with the second grounding conductive layer 220 through a fourth through hole GK4. The third through hole GK3 and the fourth through hole GK4 penetrate through the third insulating layer 530 respectively. In this way, the balun structure may be formed in a form of striplines, since the first grounding conductive layer 210 and the second grounding conductive layer 220 are arranged, there are metal layers on two sides of the first transmission line 310, the second transmission line 320, the third transmission line 330 and the coupling structure 400, so that crosstalk and electromagnetic interference radiation can be reduced, and signal transmission is more stable. Since the second grounding conductive layer 220 is arranged in a grounding mode, the end of the first branch line (such as 411) close to the second coupling part 420 is electrically connected with the second grounding conductive layer 220 through the third through hole GK3, in this way, when the grounding performance of the end of the first branch line (such as 411) close to the second coupling part 420 realized through the first through hole GK1 is poor, the grounding performance of the end of the first branch line (such as 411) close to the second coupling part 420 may further be realized through the third through hole GK3, which further ensures the grounding performance of the first branch line (such as 411). Alternatively, when the grounding performance of the end of the first branch line (such as 411) close to the second coupling part 420 realized through the third through hole GK3 is poor, the grounding performance of the end of the first branch line (such as 411) close to the second coupling part 420 may further be realized through the first through hole GK1, which further ensures the grounding performance of the first branch line (such as 411). In addition, the end of the second branch line (such as 421) close to the first coupling part 410 is electrically connected with the second grounding conductive layer 220 through a fourth through hole GK4, in this way, when the grounding performance of the end of the second branch line (such as 421) close to the first coupling part 410 realized through the second through hole GK2 is poor, the grounding performance of the end of the second branch line (such as 421) close to the first coupling part 410 may further be realized through the fourth through hole GK4, which further ensures the grounding performance of the second branch line (such as 421). Alternatively, when the grounding performance of the end of the second branch line (such as 421) close to the first coupling part 410 realized through the second through hole GK2 is poor, the grounding performance of the end of the second branch line (such as 421) close to the first coupling part 410 may further be realized through the fourth through hole GK4, which further ensures the grounding performance of the second branch line (such as 421).

It needs to be noted that the third insulating layer 530 may cover the first transmission line 310, the second transmission line 320, the first end 330-*a* and the second end 330-*b* of the third transmission line 330 and the coupling structure 400.

In the embodiment of the present disclosure, a layer of metal materials (such as Cu, Ag, Au and Al) may be plated on side walls of the third through hole and the fourth through hole, or the third through hole and the fourth through hole may also be filled with the metal materials (such as Cu, Ag, Au and Al) first, then the first branch line is connected with the metal materials filling in the third through hole, and the second branch line is connected with the metal materials filling in the fourth through hole.

Figure 7:
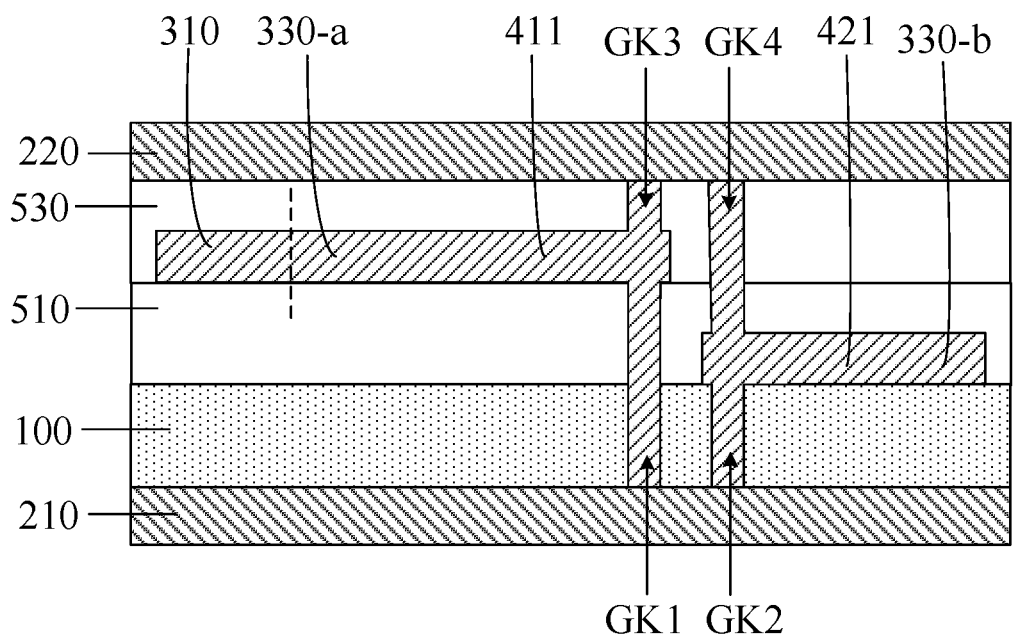
FIG. 7 is yet some schematic sectional views of the balun structure shown in FIG. 1A in the direction AA'.

In the embodiment of the present disclosure, as shown in FIG. 7, when the balun structure further includes the first insulating layer 510, the fourth through hole GK4 further penetrates through the first insulating layer 510.

Figure 8:
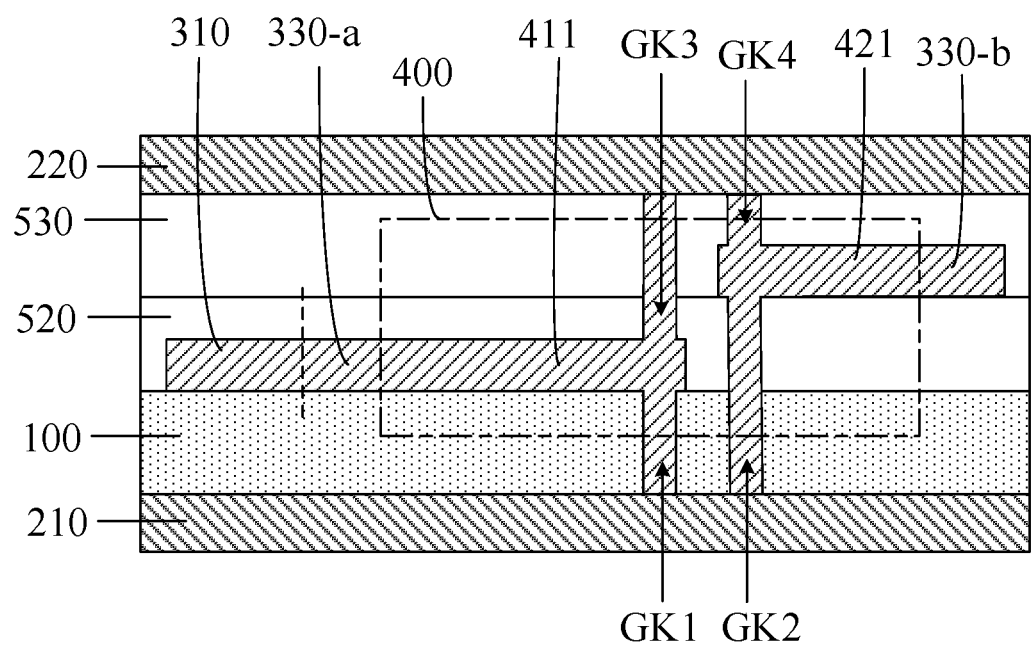
FIG. 8 is yet some schematic sectional views of the balun structure shown in FIG. 1A in the direction BB'.

In the embodiment of the present disclosure, as shown in FIG. 8, when the balun structure further includes the second insulating layer 520, the third through hole GK3 further penetrates through the second insulating layer 520.

Figure 9:
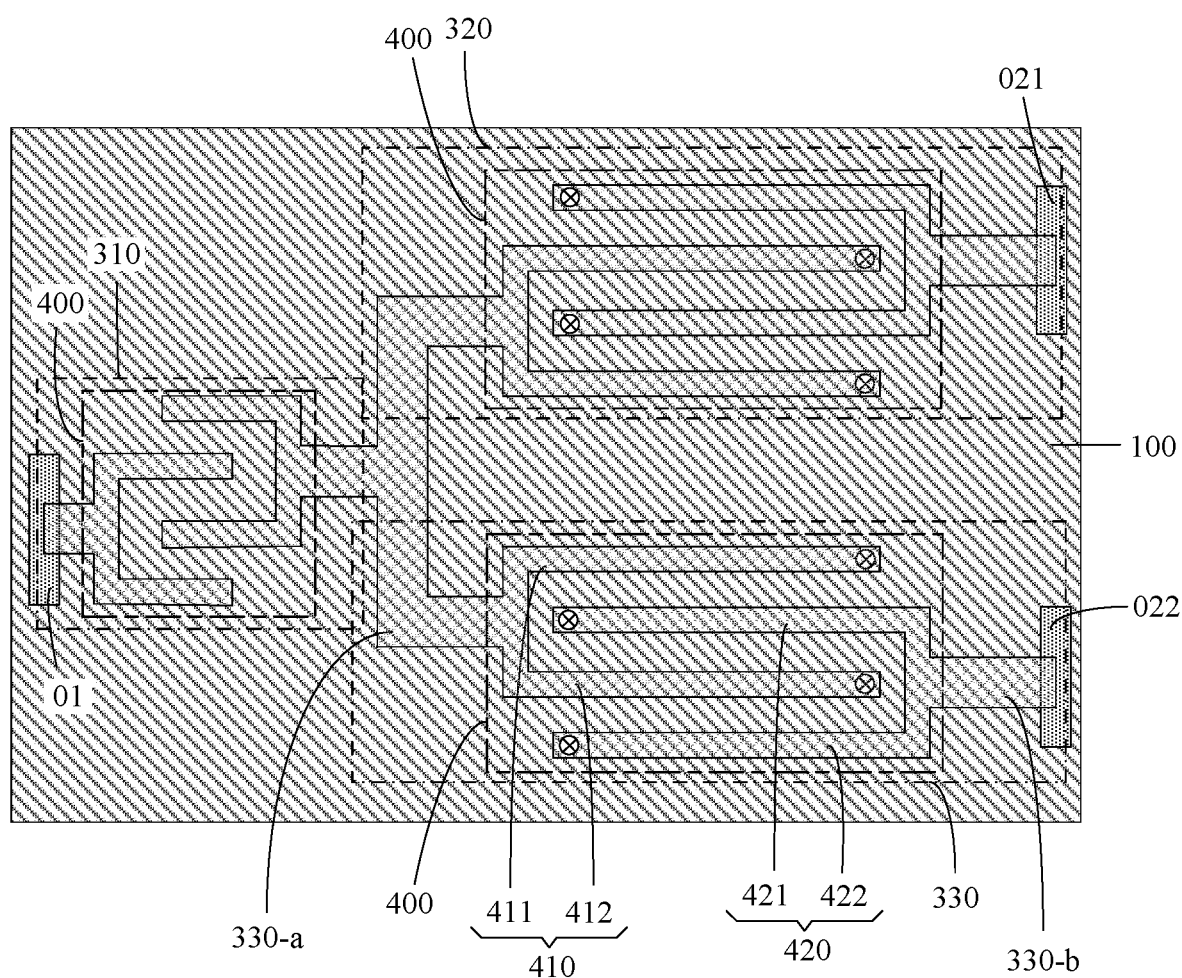
FIG. 9 is yet some schematic top views of a balun structure provided by an embodiment of the present disclosure.

The embodiment of the present disclosure provides yet some schematic structural diagrams of the balun structure, as shown in FIG. 9, and transformation is performed for the implementation of the above embodiments. Only the difference between the present embodiment and the above embodiments is explained below, and similarities are omitted here.

In the embodiment of the present disclosure, as shown in FIG. 9, the coupling structure 400 may be connected in series between the first end and the second end of the second transmission line 320. Exemplarily, there may be one, two, three or more coupling structures, which may be determined according to the requirements of practical applications, and is not limited here. It needs to be noted that an implementation of the coupling structure arranged between the first end and the second end of the second transmission line 320 may be basically the same as that of the coupling structure arranged between the first end and the second end of the third transmission line 330, which is not repeated here.

In the embodiment of the present disclosure, as shown in FIG. 9, the coupling structure 400 may also be connected in series between the first end and the second end of the first transmission line 310. Exemplarily, there may be one, two, three or more coupling structures, which may be determined according to the requirements of practical applications, and is not limited here. It needs to be noted that an implementation of the coupling structure arranged between the first end and the second end of the first transmission line 310 may be basically the same as that of the coupling structure arranged between the first end and the second end of the third transmission line 330, which is not repeated here.

Figure 10A:
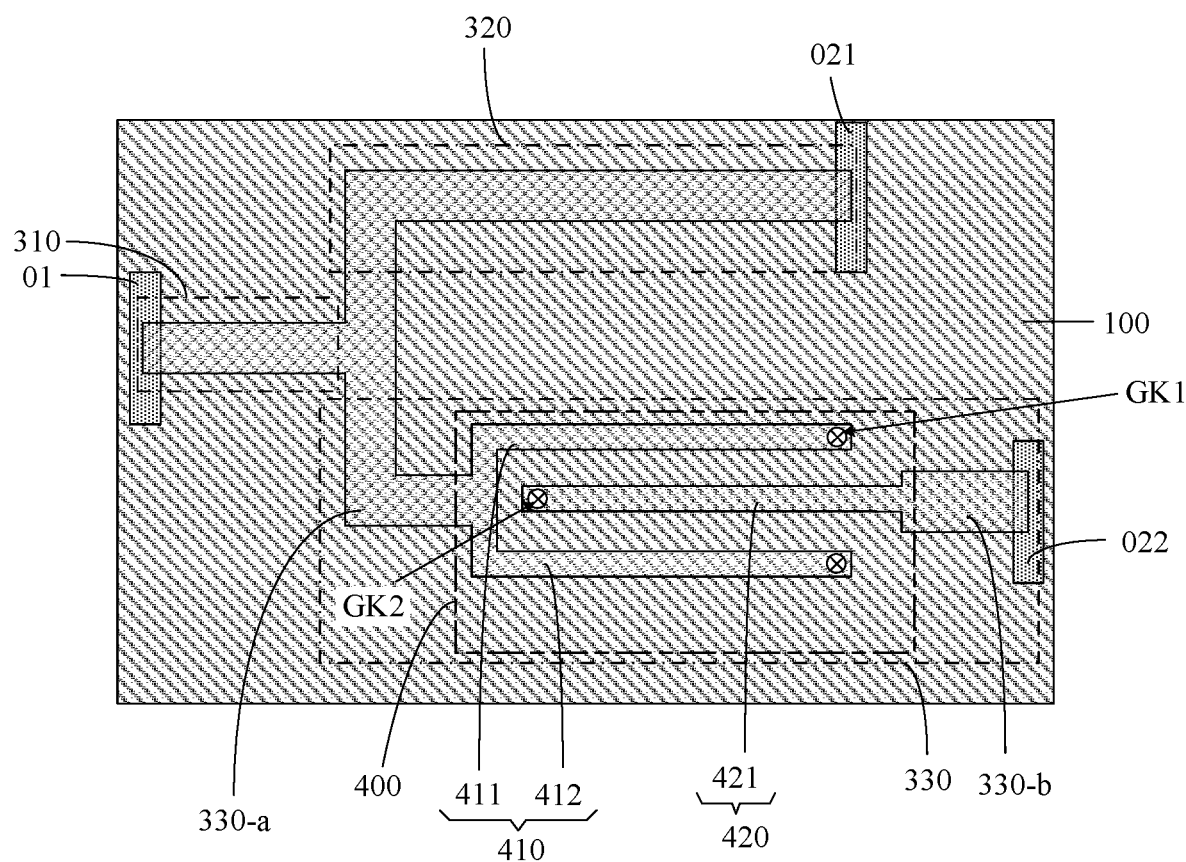
FIG. 10A is yet some schematic top views of a balun structure provided by an embodiment of the present disclosure.
Figure 10B:
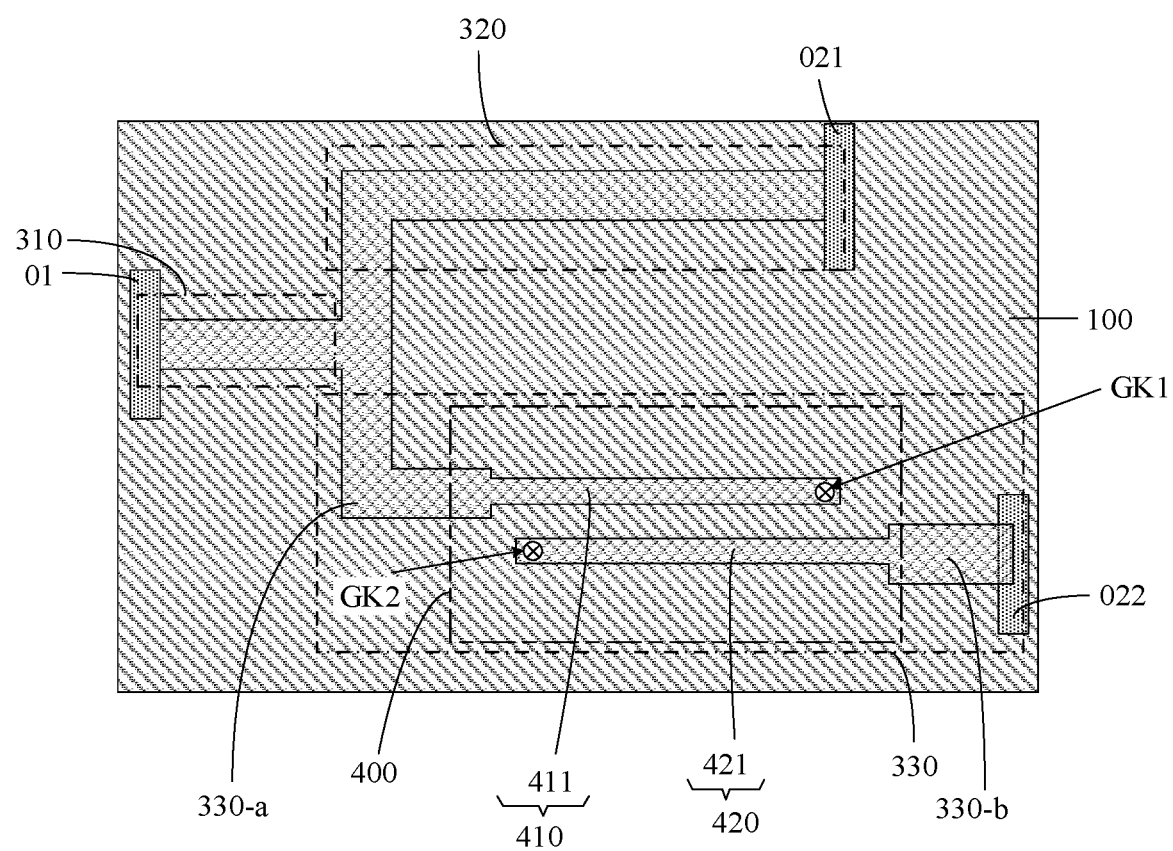
FIG. 10B is yet some schematic top views of a balun structure provided by an embodiment of the present disclosure.

The embodiment of the present disclosure provides yet some schematic structural diagrams of the balun structure, as shown in FIG. 10A and FIG. 10B, and transformation is performed for the implementation of the above embodiments. Only the difference between the present embodiment and the above embodiments is explained below, and similarities are omitted here.

Exemplarily, as shown in FIG. 10A, in the same coupling structure 400, one end of the first coupling part 410 facing the second coupling part 420 has at least two first branch lines (such as 411 and 412), and one end of the second coupling part 420 facing the first coupling part 410 has at least one second branch line (such as 421). In the same coupling structure 400, one end of each of the first branch lines (such as 411 and 412) close to the second coupling part 420 are electrically connected with the first grounding conductive layer 210 through the first through hole GK1, and one end of the second branch line (such as 421) close to the first coupling part 410 is electrically connected with the first grounding conductive layer 210 through the second through hole GK2; and in the same coupling structure 400, the first branch lines of the first coupling part 410 are in coupling connection with the second branch line of the second coupling part 420. For example, the second branch line 421 and the first branch lines 411 and 412 have gaps therebetween and are in coupling connection. In this way, signals transmitted to the first branch lines (such as 411 and 412) may be transmitted to the second branch line (such as 421) through a coupling effect, so as to be transmitted to a connected device through the second end 330-b of the third transmission line 330. Alternatively, signals transmitted to the second branch line (such as 421) may be transmitted to the first branch lines (such as 411 and 412) through the coupling effect, so as to be transmitted to a device connected to the first transmission line 310 through the first end 330-a of the third transmission line 330.

Exemplarily, as shown in FIG. 10B, in the same coupling structure 400, the end of the first coupling part 410 facing the second coupling part 420 has at least one first branch line (such as 411), and the end of the second coupling part 420 facing the first coupling part 410 has one second branch line (such as 421). In the same coupling structure 400, one end of the first branch line (such as 411) close to the second coupling part 420 is electrically connected with the first grounding conductive layer 210 through the first through hole GK1, and one end of the second branch line (such as 421) close to the first coupling part 410 is electrically connected with the first grounding conductive layer 210 through the second through hole GK2; and in the same coupling structure 400, the first branch line of the first coupling part 410 is in coupling connection with the second branch line of the second coupling part 420. For example, the second branch line 421 and the first branch line 411 have a gap therebetween and are in coupling connection. In this way, signals transmitted to the first branch line (such as 411) may be transmitted to the second branch line (such as 421) through the coupling effect, so as to be transmitted to the connected device through the second end 330-b of the third transmission line 330. Alternatively, signals transmitted to the second branch line (such as 421) may be transmitted to the first branch line (such as 411) through the coupling effect, so as to be transmitted to the device connected to the first transmission line 310 through the first end 330-a of the third transmission line 330.

It needs to be noted that, in practical applications, the quantity of the first branch lines in the first coupling part may be 3, 4, etc., which may be determined according to the needs of practical application, and is not limited here.

It needs to be noted that, in practical applications, the quantity of the second branch lines in the second coupling part may be 3, 4, etc., which may be determined according to the needs of practical application, and is not limited here.

An embodiment of the present disclosure further provides an electronic device, including any above balun structure. The principle for solving problems of the electronic device is similar to that of the aforementioned balun structure, and thus the implementation of the electronic device may refer to the implementation of the aforementioned balun structure, and repetitions are omitted here.

In the embodiment of the present disclosure, the electronic device may be, for example, a communication base station product, a mobile product, and a product with other structures provided with chips, balanced antennas and other devices, which is not limited here.

Although the preferred embodiments of the present disclosure have been described, those skilled in the art can make additional changes and modifications to these embodiments once they know the basic creative concept. Thus, the appended claims are intended to be construed to include the preferred embodiments and all changes and modifications that fall within the scope of the present disclosure.

Apparently, those skilled in the art can make various modifications and variations to the embodiments of the present disclosure without departing from the spirit and scope of the embodiments of the present disclosure. In this way, under the condition that these modifications and variations to the embodiments of the present disclosure fall within the scope of the claims of the present disclosure and their equivalent technologies, the present disclosure is also intended to include these modifications and variations.

What is claimed is:

1. A balun structure, comprising:
a dielectric substrate;
a first grounding conductive layer on one side of the dielectric substrate;
a first transmission line on one side of the dielectric substrate away from the first grounding conductive layer, wherein a first end of the first transmission line is electrically connected with an unbalanced signal port;
a second transmission line on the side of the dielectric substrate away from the first grounding conductive layer, wherein a first end of the second transmission line is electrically connected with a second end of the first transmission line, and a second end of the second transmission line is electrically connected with a first balanced signal port; and
a third transmission line on the side of the dielectric substrate away from the first grounding conductive layer, wherein a first end of the third transmission line is electrically connected with the second end of the first transmission line, and a second end of the third transmission line is electrically connected with a second balanced signal port;
wherein at least one coupling structure is connected in series between the first end and the second end of the third transmission line; the coupling structure comprises a first coupling part and a second coupling part; and in a same coupling structure, one end of the first coupling part facing the second coupling part is provided with at least one first branch line, and one end of the second coupling part facing the first coupling part is provided with at least one second branch line; and
in the same coupling structure, one end of the first branch line close to the second coupling part is electrically connected with the first grounding conductive layer through a first through hole, and one end of the second branch line close to the first coupling part is electrically connected with the first grounding conductive layer through a second through hole; and in the same coupling structure, the first branch line of the first coupling part is in coupling connection with the second branch line of the second coupling part.

2. The balun structure according to claim 1, wherein in the same coupling structure, orthographic projections of the first branch line and the second branch line on the dielectric substrate are alternately arranged at intervals.

3. The balun structure according to claim 2, wherein the first coupling part and the second coupling part in each coupling structure are arranged in one same layer.

4. The balun structure according to claim 3, wherein the first transmission line, the second transmission line, the third transmission line and each coupling structure are located in one same film layer.

5. The balun structure according to claim 3, further comprising:

a third insulating layer, covering the first transmission line, the second transmission line and the third transmission line; and
a second grounding conductive layer on one side of the third insulating layer away from the dielectric substrate;
wherein one end of the first branch line close to the second coupling part is electrically connected with the second grounding conductive layer through a third through hole, and one end of the second branch line close to the first coupling part is electrically connected with the second grounding conductive layer through a fourth through hole; and the third through hole and the fourth through hole each penetrate through the third insulating layer.

6. The balun structure according to claim 3, wherein at least one coupling structure is connected in series between the first end and the second end of at least one of the first transmission line or the second transmission line.

7. The balun structure according to claim 2, wherein the first coupling part and the second coupling part in at least one coupling structure are arranged in different layers.

8. The balun structure according to claim 7, wherein the first transmission line, the second transmission line and the first coupling part are located in one same film layer;
the second coupling part is between the first coupling part and the dielectric substrate;
the balun structure further comprises:
a first insulating layer between the second coupling part and the first coupling part; wherein the first through hole further penetrates through the first insulating layer.

9. The balun structure according to claim 7, wherein the first transmission line, the second transmission line and the first coupling part are located in one same film layer;
the second coupling part is on one side of the first coupling part away from the dielectric substrate;
the balun structure further comprises:
a second insulating layer between the second coupling part and the first coupling part; wherein the second through hole further penetrates through the second insulating layer.

10. The balun structure according to claim 7, further comprising:
a third insulating layer, covering the first transmission line, the second transmission line and the third transmission line; and
a second grounding conductive layer on one side of the third insulating layer away from the dielectric substrate;
wherein one end of the first branch line close to the second coupling part is electrically connected with the second grounding conductive layer through a third through hole, and one end of the second branch line close to the first coupling part is electrically connected with the second grounding conductive layer through a fourth through hole; and the third through hole and the fourth through hole each penetrate through the third insulating layer.

11. The balun structure according to claim 2, further comprising:
a third insulating layer, covering the first transmission line, the second transmission line and the third transmission line; and
a second grounding conductive layer on one side of the third insulating layer away from the dielectric substrate;

wherein one end of the first branch line close to the second coupling part is electrically connected with the second grounding conductive layer through a third through hole, and one end of the second branch line close to the first coupling part is electrically connected with the second grounding conductive layer through a fourth through hole; and the third through hole and the fourth through hole each penetrate through the third insulating layer.

12. The balun structure according to claim 2, wherein at least one coupling structure is connected in series between the first end and the second end of at least one of the first transmission line or the second transmission line.

13. The balun structure according to claim 2, wherein in the same coupling structure, shapes of orthographic projections of the first branch line and the second branch line on the dielectric substrate comprise a straight line, a bent line, a wavy line and a curve.

14. The balun structure according to claim 2, further comprising:
   at least one resistor, electrically connected between the second end of the second transmission line and the second end of the third transmission line.

15. The balun structure according to claim 1, further comprising:
   a third insulating layer, covering the first transmission line, the second transmission line and the third transmission line; and
   a second grounding conductive layer on one side of the third insulating layer away from the dielectric substrate;
   wherein one end of the first branch line close to the second coupling part is electrically connected with the second grounding conductive layer through a third through hole, and one end of the second branch line close to the first coupling part is electrically connected with the second grounding conductive layer through a fourth through hole; and the third through hole and the fourth through hole each penetrate through the third insulating layer.

16. The balun structure according to claim 15, wherein when the balun structure further comprises the first insulating layer, the fourth through hole further penetrates through the first insulating layer; and
   when the balun structure further comprises the second insulating layer, the third through hole further penetrates through the second insulating layer.

17. The balun structure according to claim 1, wherein at least one coupling structure is connected in series between the first end and the second end of at least one of the first transmission line or the second transmission line.

18. The balun structure according to claim 1, wherein in the same coupling structure, shapes of orthographic projections of the first branch line and the second branch line on the dielectric substrate comprise a straight line, a bent line, a wavy line and a curve.

19. The balun structure according to claim 1, further comprising:
   at least one resistor, electrically connected between the second end of the second transmission line and the second end of the third transmission line.

20. An electronic device, comprising the balun structure according to claim 1.

* * * * *